United States Patent
Wu et al.

(10) Patent No.: US 9,658,536 B2
(45) Date of Patent: May 23, 2017

(54) IN-LINE INSPECTION AND CLEAN FOR IMMERSION LITHOGRAPHY

(71) Applicant: TAIWAN SEMICONDUCTOR MANUFACTURING CO., LTD., Hsinchu (TW)

(72) Inventors: Tung-Li Wu, Hsinchu (TW); Heng-Hsin Liu, New Taipei (TW); Jui-Chun Peng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 97 days.

(21) Appl. No.: 14/189,975

(22) Filed: Feb. 25, 2014

(65) Prior Publication Data
US 2015/0241789 A1 Aug. 27, 2015

(51) Int. Cl.
*G03F 7/20* (2006.01)
(52) U.S. Cl.
CPC ...... *G03F 7/70341* (2013.01); *G03F 7/70925* (2013.01)
(58) Field of Classification Search
CPC ............. G03F 7/70341; G03F 7/70716; G03F 7/70925; G03F 7/7085
See application file for complete search history.

(56) References Cited

U.S. PATENT DOCUMENTS

| | | | | |
|---|---|---|---|---|
| 2006/0077367 A1* | 4/2006 | Kobayashi | ............. | G03B 27/52 355/53 |
| 2007/0258072 A1* | 11/2007 | Nagasaka | ........... | G03F 7/70341 355/53 |
| 2009/0015805 A1* | 1/2009 | Jansen | ................ | G03F 7/70925 355/30 |
| 2009/0061331 A1* | 3/2009 | Nakano | ............... | G03F 7/70341 430/30 |
| 2009/0103064 A1* | 4/2009 | Yoda | ................... | G03F 7/70341 355/30 |
| 2009/0109413 A1* | 4/2009 | Shibazaki | ........... | G03F 7/70925 355/30 |
| 2009/0174870 A1* | 7/2009 | De Jong | ............. | G03F 7/70341 355/30 |
| 2010/0245790 A1* | 9/2010 | Seltmann | ............ | G03F 7/70341 355/30 |

* cited by examiner

*Primary Examiner* — Steven H Whitesell Gordon
(74) *Attorney, Agent, or Firm* — McDermott Will & Emery LLP

(57) ABSTRACT

An immersion lithography apparatus includes a lens system, an immersion hood, a wafer stage, an inspection system and a cleaning fluid supplier. The lens system is configured to project a pattern onto a wafer. The immersion hood is configured to confine an immersion fluid between the lens system and the wafer, and includes a peripheral hole configured to suck up the immersion fluid. The wafer stage is configured to position the wafer under the lens system. The inspection system is configured to detect whether there is contamination in the peripheral hole. The cleaning fluid supplier is coupled to the inspection system and configured to supply a cleaning fluid through the peripheral hole to remove the contamination, in which the inspection system and the cleaning fluid supplier are coupled to the wafer stage.

20 Claims, 6 Drawing Sheets

IN-LINE INSPECTION AND CLEAN FOR IMMERSION LITHOGRAPHY

BACKGROUND

As semiconductor fabrication technologies are continually progressing to smaller feature sizes, immersion lithography apparatus and methods are being adopted. Immersion lithography is a technique that can enhance the resolution of projection lithography by permitting exposures with a numerical aperture (NA) greater than one, which is the theoretical maximum for conventional "dry" systems. By filling the space between a final optical element and a semiconductor wafer, the immersion lithography permits exposure with light that would otherwise be totally internally reflected at an optic-air interface.

When an exposure process is performed using the immersion lithography apparatus, contamination such as particles and water residues may be remained on and thus to contaminate the semiconductor wafer to be processed therein. Such contamination may cause defects and yield degradations of the semiconductor wafers. Accordingly, improvements in immersion lithography apparatus and methods for effective inspection and cleaning of contamination continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
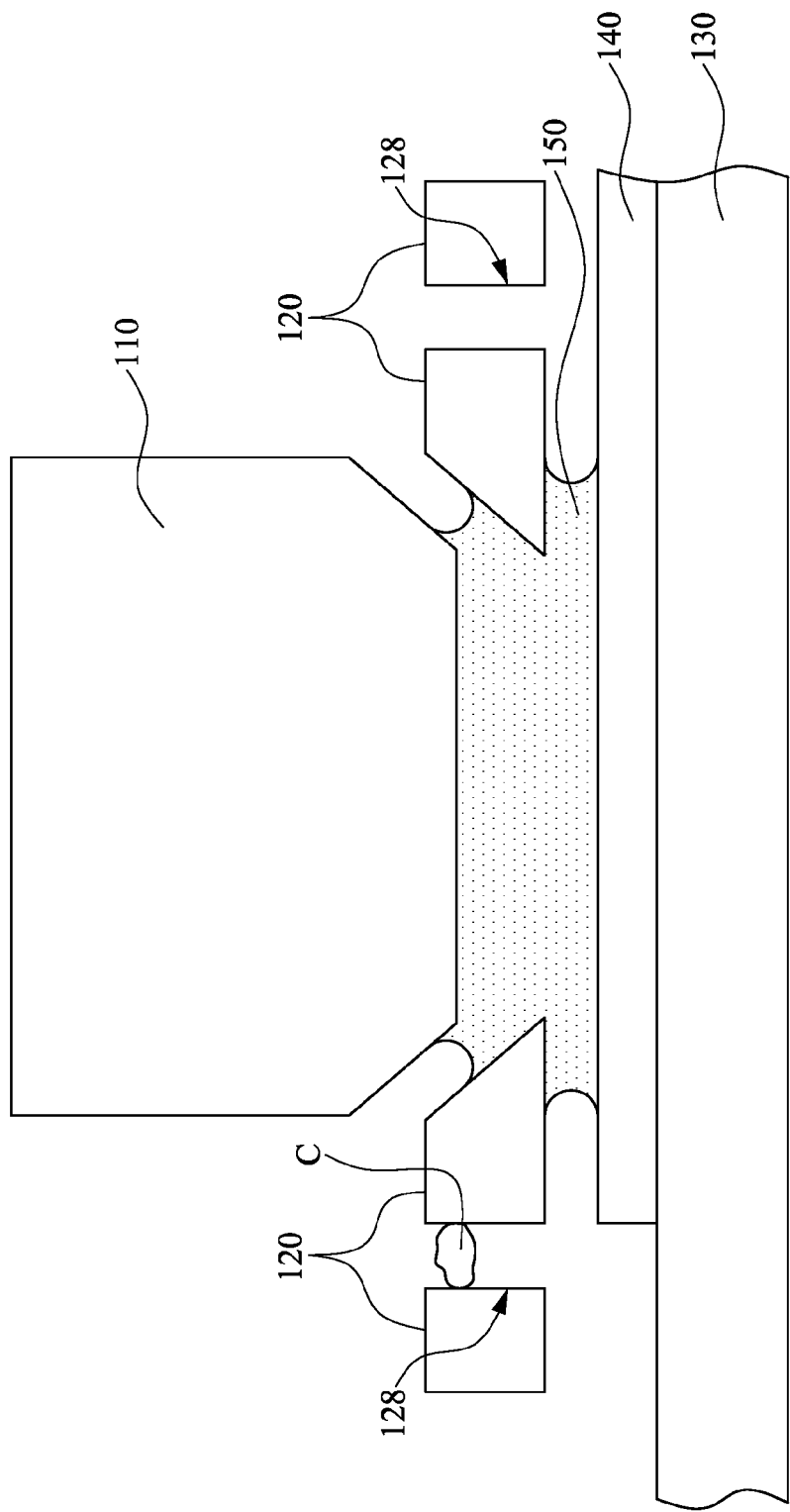
FIG. 1 is a cross-sectional view of a general immersion lithography apparatus.

The following disclosure provides many different embodiments, or examples, for implementing different features of the provided subject matter. Specific examples of components and arrangements are described below to simplify the present disclosure. These are, of course, merely examples and are not intended to be limiting. For example, a first feature is disposed over or on a second feature in the description that follows may include embodiments in which the first and second features are in direct contact, and may also include embodiments in which additional features may be disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terminology used herein is for the purpose of describing particular embodiments only and is not intended to be limiting of the disclosure. As used herein, the singular forms "a", "an" and "the" are intended to include the plural forms as well, unless the context clearly indicates otherwise.

Further, spatially relative terms, such as "under," "upper," "lower" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In use of a general immersion lithography apparatus, particles and water residues may usually remain on a semiconductor wafer. Such contamination may cause defects and yield degradations of the semiconductor wafers.

FIG. 1 is a cross-sectional view of a general immersion lithography apparatus 10. The immersion lithography apparatus 10 includes a lens system 110, an immersion hood 120 and a wafer stage 130. The lens system 110 is configured to project a pattern onto a wafer 140, which is held by the wafer stage 130. The wafer stage 130 may be moved to let the lens system 110 sequentially project a same pattern onto a plurality of regions of the wafer 140 during an exposure process. The immersion hood 120 is configured to confine an immersion fluid 150 between an end of the lens system 110 and the wafer 140. Because of the presence of the immersion fluid 150, the immersion lithography apparatus 10 can exhibit excellent optical performance so as to fabricate semiconductor devices with smaller feature sizes.

After the exposure process is performed, the wafer stage 130 may be moved, and the immersion fluid 150 may be in contact with another region of the wafer 140. However, some immersion fluid 150 may be remained on an original region of the wafer 140, which has been processed by the lens system 110. In order to prevent occurrence of the phenomenon, the immersion hood 120 further includes a plurality of peripheral holes 128 configured to suck up the immersion fluid 150. However, as shown in FIG. 1, if one of the peripheral holes 128 is blocked by contamination C such as a particle, the immersion fluid 150 cannot be sucked up through the peripheral hole 128, resulting in residual immersion fluid 150 on the wafer 140. Defects may be therefore generated on the wafer 140, which may cause the wafer 140 to be scrapped. A critical dimension scanning electron microscope (CD-SEM) may be utilized to monitor contamination but costly. Also, it is not effectively to manually conduct the inspection and cleaning processes of contamination.

To address the issue, the present disclosure provides a novel immersion lithography apparatus including an inspection system and a cleaning fluid supplier to perform in-line detection and cleaning of the peripheral holes 128 before or during the exposure process. Various embodiments of the novel immersion lithography apparatus will be described in detail below.

Figure 2:
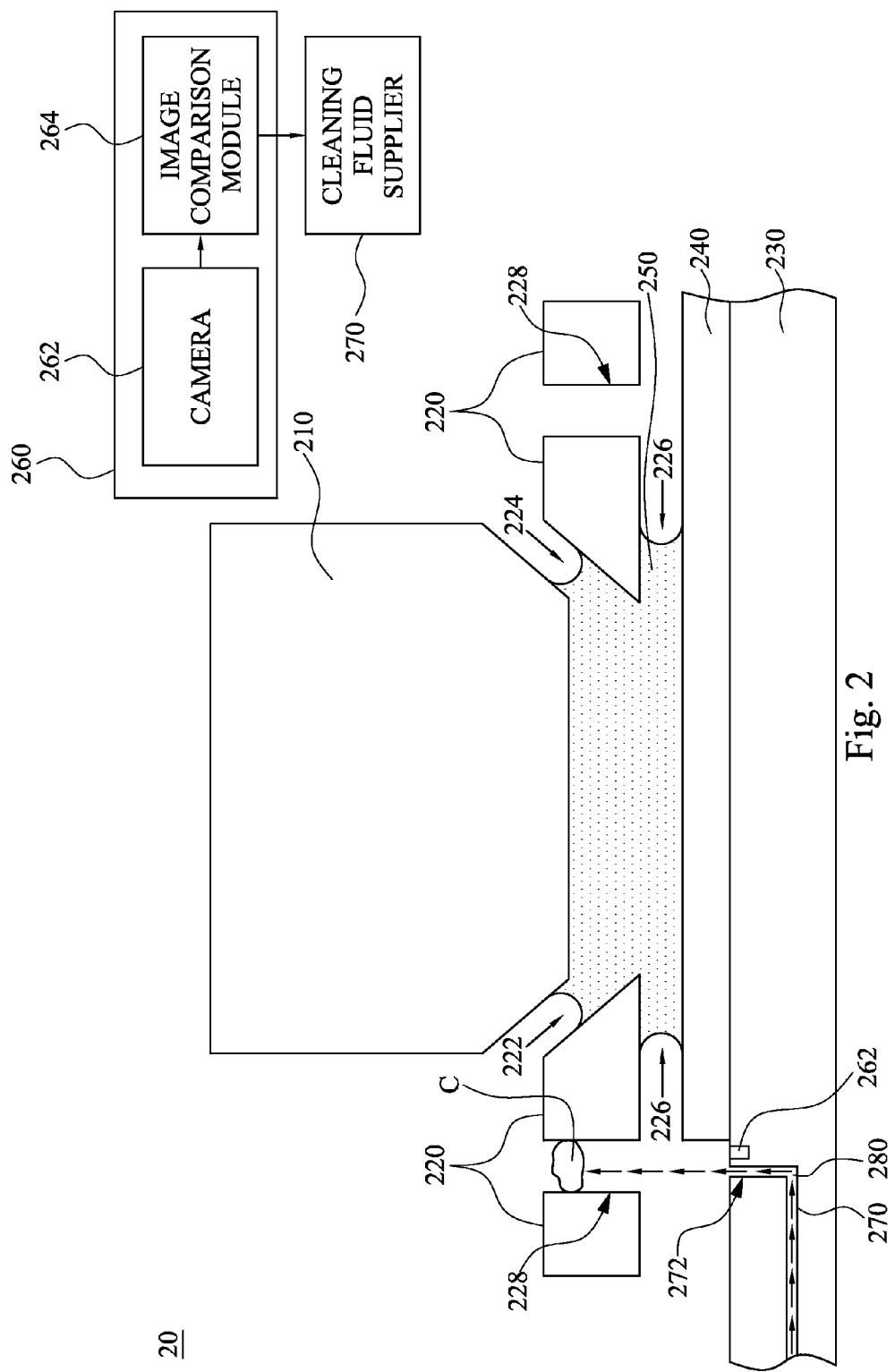
FIG. 2 is a cross-sectional view of an immersion lithography apparatus in accordance with some embodiments.

FIG. 2 is a cross-sectional view of a novel immersion lithography apparatus 20 for in-line detection and cleaning during an exposure process in accordance with some embodiments. As shown in FIG. 2, the immersion lithography apparatus 20 includes a lens system 210, an immersion hood 220, a wafer stage 230, an inspection system 260 and a cleaning fluid supplier 270.

The lens system 210 (or called as imaging lens system) is configured to project a pattern onto a wafer 240. The lens system 210 may have a single lens or multiple lenses and/or other lens elements and may be integrated with an illumination system (not shown). For example, the lens system 210 may include an objective lens, which may have a single lens element or a plurality of lens elements. The materials used for each lens element may be chosen based on the wavelength of light used in the immersion lithography process to minimize absorption and scattering.

The immersion hood 220 may be positioned proximate an end of the lens system 210. The immersion hood 220 is configured to confine an immersion fluid 250 between the lens system 210 and the wafer 240. The immersion fluid 250 may include de-ionized water (DIW), water solution or other proper fluid having an index of refraction higher than that of water. The immersion hood 220 may include an aperture 222 as an immersion fluid inlet to provide and transfer fresh immersion fluid 250 into a space between the lens system 210 and the wafer 240. The immersion hood 220 may also include an aperture 224 as an immersion fluid outlet to remove and transfer the immersion fluid 250 from the space. In various embodiments, the immersion fluid 250 is circulated through the apertures 222, 224 during the exposure process. It is understood that the immersion fluid 250 may be provided to and removed from the space with a sufficient rate. The immersion hood 220 may also be designed to provide another fluid such as dry air through apertures 226 for constraining the immersion fluid 250.

The wafer stage 230 is configured to hold and position the wafer 240 under the lens system 210. The wafer stage 230 may include various components suitable for performing precise movement and positioning with nanoscale accuracy. The wafer 240 to be processed by the immersion lithography apparatus 20 may be a semiconductor wafer such as a silicon wafer. Alternatively, the semiconductor wafer may include an elementary semiconductor, a compound semiconductor, an alloy semiconductor or combinations thereof. The semiconductor wafer may include one or more material layers such as poly-silicon, metal, and/or dielectric, to be patterned. The wafer may further include an imaging layer (not shown) formed thereon. The imaging layer may be a photoresist layer (or called as resist layer, photo sensitive layer, patterning layer) that is responsive to the exposure process for creating patterns. The imaging layer may be a positive or negative type resist material and may be a single-layer or multi-layer structure.

Figure 3:
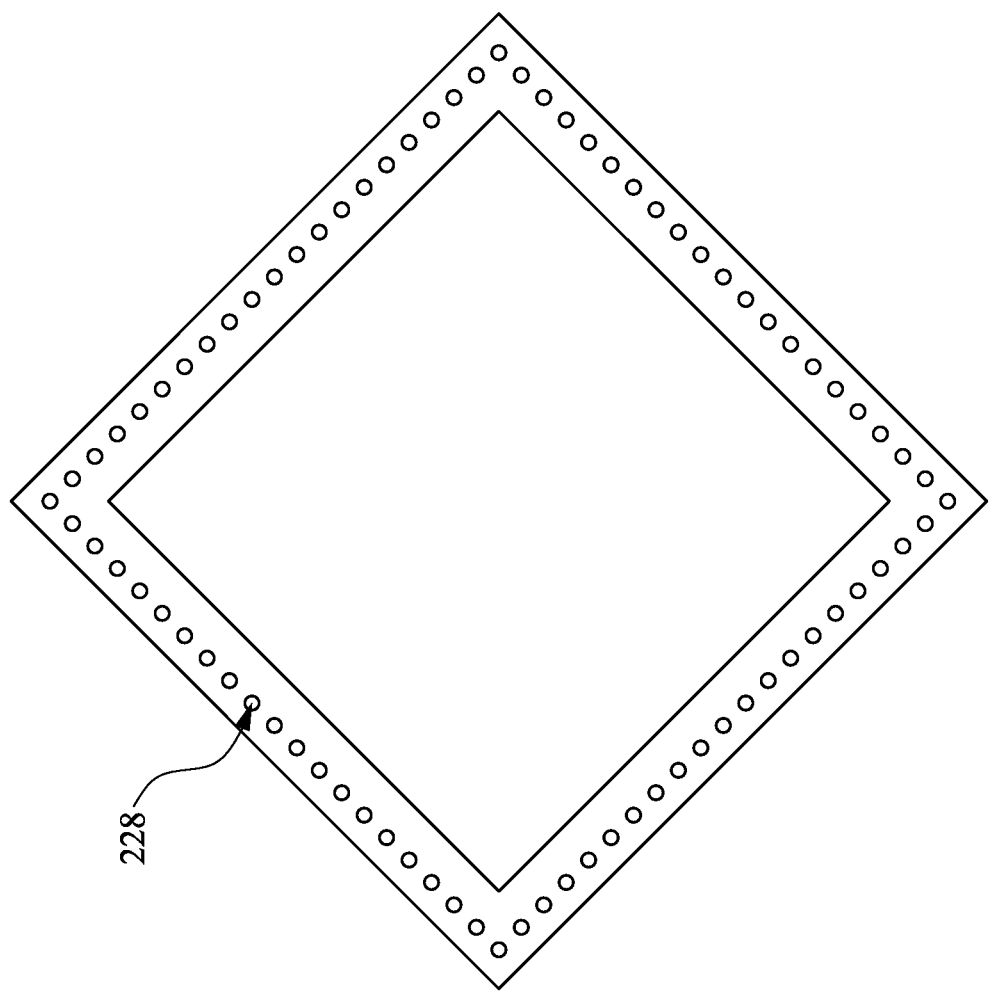
FIG. 3 is a top view of an immersion hood in accordance with some embodiments.

After the exposure process is performed on the region of the wafer 240, the wafer stage 230 may be moved to let the lens system 210 project the pattern onto another region of the wafer 240. In order not to remain any immersion fluid 250 on the processed region of the wafer 240, the immersion hood 220 further includes a plurality of peripheral holes 228 disposed adjacent to an edge of the immersion hood 220 and configured to suck up the immersion fluid 250. FIG. 3 is a top view of an immersion hood 220 in accordance with some embodiments. The peripheral holes 228 are adjacent to and arranged along the edge of the immersion hood 220 to suck up all of the residual immersion fluid 250 as far as possible. In various embodiments, the peripheral hole 228 has a diameter in a range of from 40 microns to 80 microns. However, the size and the arrangement of the peripheral holes 228 may be appropriately adjusted based on actual needs, and not limited to those shown in FIG. 3. In addition, in various embodiments, as shown in FIG. 2, the peripheral hole 228 is vertically through the immersion hood 220; specifically, an axis (or called as long axis) of the peripheral hole 228 is vertical to an upper or lower surface of the immersion hood 220.

Referring back to FIG. 2, to solve the problem that the peripheral holes 228 may be blocked by contamination C, which may result in residual immersion fluid 250 on the wafer 240, the inspection system 260 and the cleaning fluid supplier 270 coupled thereto are provided to perform in-line detection and cleaning of the peripheral holes 228. The inspection system 260 and the cleaning fluid supplier 270 are coupled to the wafer stage 230. For instance, the inspection system 260 may detect whether is contamination C in the peripheral hole 228, and the location of the peripheral hole 228 having the contamination C may be remembered by a controller (not shown) of the wafer stage 230 coupled to the inspection system 260. The controller may be a CPU. Afterwards, the cleaning fluid supplier 270 may provide a cleaning fluid 280 through the peripheral hole 228, which is controlled by the controller coupled to the cleaning fluid supplier 270, so as to remove the contamination C. After the cleaning process is performed using the cleaning fluid supplier 270, the inspection system 260 may check whether the contamination C has been removed.

The inspection system 260 is configured to detect whether there is the contamination C in the peripheral holes 228. As shown in FIG. 2, the inspection system 260 includes a camera 262 and an image comparison module 264 coupled thereto. The camera 262 is configured to capture images of the peripheral holes 228. The camera 262 may be a charged coupled device (CCD) camera used to convert light into electrical current. In various embodiments, as shown in FIG. 2, the camera 262 is integrated with the wafer stage 230, such that all of the peripheral holes 228 shown in FIG. 3 may be scanned using the camera 262 by moving the wafer stage 230. In addition, in various embodiments, the camera 262 is watertight so as not to be deteriorated by the immersion fluid 250 during the exposure process. In various embodiments, a protective layer (not shown) such as a cover glass is formed on the camera 262.

The image comparison module 264 is coupled between the camera 262 and the cleaning fluid supplier 270, and configured to compare the image captured by the camera 262 with a comparison image to confirm whether there is the contamination C in the peripheral hole 228. The comparison image is acted as an absolute reference to the subsequently obtained images. When the image of the peripheral hole 228 is the same as the comparison image, there is no contamination in the peripheral hole 228; in contrast, when the image of the peripheral hole 228 is different from the comparison image, there is something such as the contamination C in the peripheral hole 228, and thus a cleaning process should be performed.

The controller of the wafer stage 230 described above may be coupled between the image comparison module 264 and the cleaning fluid supplier 270. The inspection results generated from the image comparison module 264 may be transferred to the controller to let the cleaning fluid supplier 270 clean the peripheral holes 228 having contamination C. The cleaning fluid supplier 270 is configured to supply a cleaning fluid 280 through the peripheral hole 228 to remove the contamination C. In various embodiments, the cleaning fluid 280 is a material selected from water, clean air, nitrogen, inert gas or a combination thereof, but not limited thereto. In various embodiments, the cleaning fluid supplier 270 has an outlet 272 parallel to the axis of the peripheral hole 228 so as to provide sufficient pressure to flush out the contamination C.

In various embodiments, in order to exhibit precise movement and positioning for in-line detection and cleaning of the peripheral holes 228, the camera 262 and the cleaning fluid supplier 270 are integrated with the wafer stage 230, as shown in FIG. 2. In various embodiments, the camera 262 and the cleaning fluid supplier 270 are embedded within the wafer stage 230. In various embodiments, the cleaning fluid supplier 270 is adjacent to the camera 262, and thus the contamination C may be immediately removed after inspection. In various embodiments, the camera 262 and the cleaning fluid supplier 270 are disposed outside a region occupied by the wafer 240. The in-line detection and cleaning may be accordingly performed during the exposure process. Moreover, in various embodiments, when the exposure process is carried out, the cleaning fluid supplier 270 is further configured to suck up the residual immersion fluid 250. That is, not only the peripheral holes 228 but also the cleaning fluid supplier 270 are utilized to remove the residual immersion fluid 250.

Figure 4:
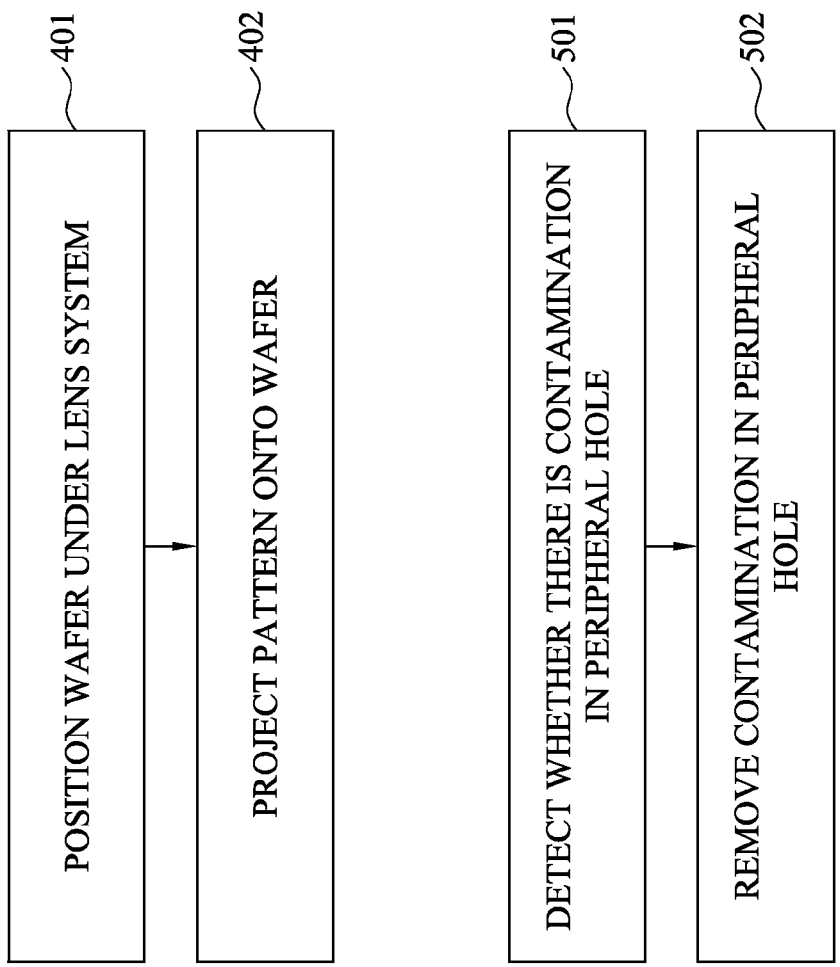
FIG. 4 is a flow chart illustrating a method for immersion lithography in accordance with some embodiments.
Figure 5:
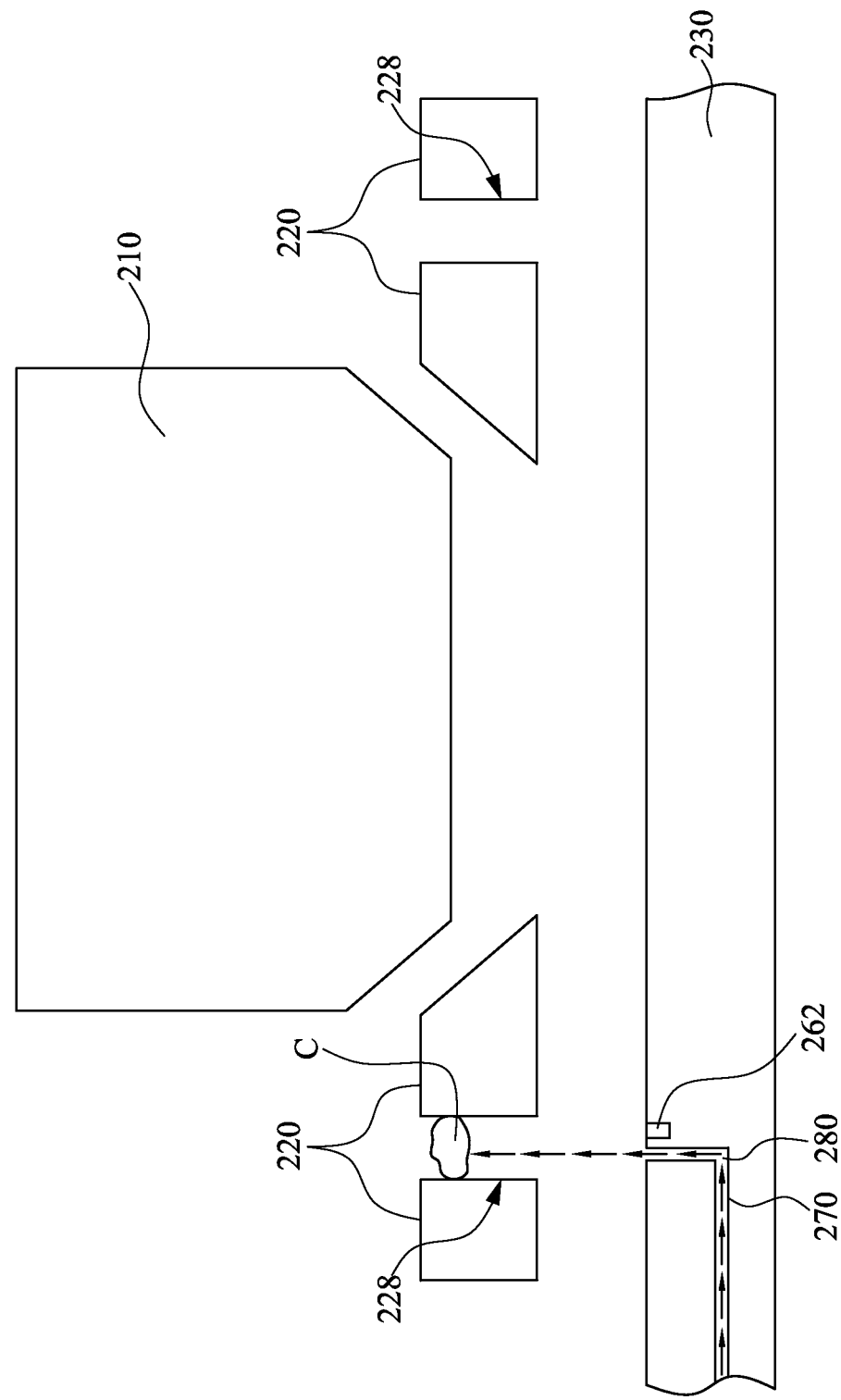
FIG. 5 is a cross-sectional view of an immersion lithography apparatus in accordance with some embodiments.
Figure 6:
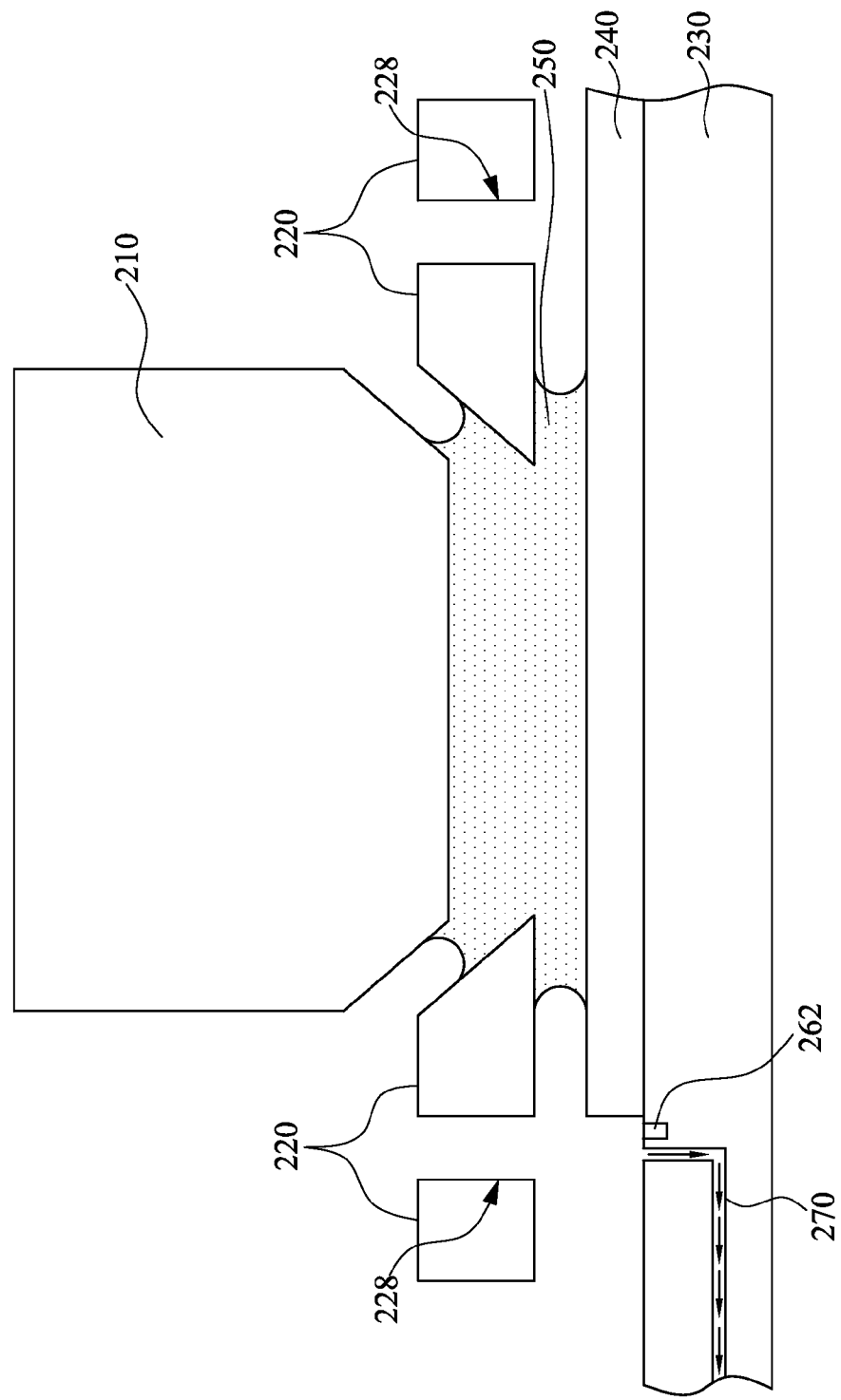
FIG. 6 is a cross-sectional view of an immersion lithography apparatus in accordance with some embodiments.

Another aspect of the present disclosure provides a method for immersion lithography. FIG. 4 is a flow chart illustrating a method for immersion lithography in accordance with some embodiments. FIG. 5 is a cross-sectional view of an immersion lithography apparatus in accordance with some embodiments. FIG. 6 is a cross-sectional view of an immersion lithography apparatus in accordance with other embodiments. The operations of the method of FIG. 4 are explained with FIGS. 2, 5-6.

In operation 401, a wafer 240 is positioned under a lens system 210 using a wafer stage 230, as shown in FIG. 2. Specifically, the wafer 240 is loaded on the wafer stage 230, and the wafer stage 230 is then moved to position the wafer 240 under the lens system 210.

In operation 402, a pattern is projected onto the wafer 240 using the lens system 210 while confining an immersion fluid 250 to a region of the wafer 240 using an immersion hood 220, as shown in FIG. 2. The immersion hood 220 includes a peripheral hole 228 configured to suck up the immersion fluid 250. In various embodiments, the peripheral hole 228 is a plurality of peripheral holes 228 configured to suck up all of the residual immersion fluid as far as possible.

In operation 501, whether there is contamination C in the peripheral hole 228 is detected using an inspection system 260, which is coupled to the wafer stage 230, as shown in FIG. 2. The inspection system 260 is configured for automatic in-line detection of the contamination C in the peripheral holes 228. A controller (not shown) of the wafer stage 230, which is coupled to the inspection system 260, may remember the location of the peripheral hole 228 having the contamination C.

Referring to FIG. 2, in various embodiments, the inspection system 260 includes a camera 262 and an image comparison module 264 coupled thereto, and operation 501 includes capturing an image of the peripheral hole 228 using the camera 262; and comparing the image with a comparison image to confirm whether there is the contamination C in the peripheral hole 228 using the image comparison module 264. In other words, the comparison image of the peripheral hole 228 without any contamination may be firstly provided to the image comparison module 264. Next, the camera 262 may capture the image of the peripheral hole 228 and then transfer to the image comparison module 264 to compare the image with the comparison image so as to confirm whether there is the contamination C in the peripheral hole 228.

In operation 502, the contamination C in the peripheral hole 228 is removed using a cleaning fluid supplier 270, which is coupled to the wafer stage 230, as shown in FIG. 2. In various embodiments, operation 502 is conducted by supplying a cleaning fluid 280 through the peripheral hole 228 by the cleaning fluid supplier 270. The cleaning fluid supplier 270 may be coupled to the controller of the wafer stage 230 described above. The inspection results generated from the inspection system 260 may be transferred to the controller to let the cleaning fluid supplier 270 clean the peripheral holes 228 having the contamination C. After operation 502, the inspection system 260 may check whether the contamination C has been removed.

In various embodiments, during the exposure process (i.e., operation 402), the in-line detection (i.e., operation 501) is performed, as shown in FIG. 2. That is, when the exposure process is performed, the camera 262 automatically captures an image of the peripheral hole 228. The image will be compared with the comparison image to confirm whether is the contamination C in the peripheral hole 228 using the image comparison module 264. If there is no contamination in the peripheral hole 228, the exposure process and the in-line detection will be continuously performed. On the contrary, if the contamination C is detected by the image comparison module 264, the exposure process will be stopped immediately, which is controlled by the controller of the wafer stage 230, and the cleaning process will then be performed.

In various embodiments, in-line detection and cleaning of the peripheral holes 228 (i.e., operations 501 and 502) are performed before positioning the wafer 240 under the lens system 210 (i.e., operation 401), as shown in FIG. 5. If there is no contamination in the peripheral hole 228 confirmed by the inspection system 260, the in-line detection will be continuously performed. If the contamination C is detected by the inspection system 260, the cleaning process will be performed. When all of the peripheral holes 228 are clean determined by the inspection system 260, the wafer 240 may then be positioned under the lens system 210.

In various embodiments, the method further includes sucking up the immersion fluid 250 using the cleaning fluid suppler 270 during the exposure process, as shown in FIG. 6. In other words, not only the peripheral holes 228 but also the cleaning fluid supplier 270 are utilized to remove the residual immersion fluid 250 during the exposure process.

In view of the above, since the immersion lithography apparatus includes the inspection system and the cleaning fluid supplier, in-line detection and cleaning of the peripheral holes of the immersion hood can be implemented to avoid residual immersion fluid remained on the wafer. Accordingly, defects and yield degradations of the semiconductor wafers, which result from the residual immersion fluid, may be significantly reduced or completely avoided.

According to some embodiments, an immersion lithography apparatus is provided, which includes a lens system, an immersion hood, a wafer stage, an inspection system and a cleaning fluid supplier. The lens system is configured to project a pattern onto a wafer. The immersion hood is configured to confine an immersion fluid between the lens system and the wafer and includes a peripheral hole configured to suck up the immersion fluid. The wafer stage is configured to position the wafer under the lens system. The inspection system is configured to detect whether there is contamination in the peripheral hole. The cleaning fluid supplier is coupled to the inspection system and configured to supply a cleaning fluid through the peripheral hole to remove the contamination, in which the inspection system and the cleaning fluid supplier are coupled to the wafer stage.

According to some embodiments, an immersion lithography apparatus is provided, which includes a lens system, an immersion hood and a wafer stage. The lens system is configured to project a pattern onto a wafer. The immersion hood is configured to confine an immersion fluid between the lens system and the wafer and includes a peripheral hole configured to suck up the immersion fluid. The wafer stage is configured to position the wafer under the lens system, in which the wafer stage includes an inspection system and a cleaning fluid supplier, which are coupled to the wafer stage. The inspection system is configured to detect whether there is contamination in the peripheral hole. The cleaning fluid supplier is coupled to the inspection system and configured to supply a cleaning fluid through the peripheral hole to remove the contamination.

According to some embodiments, a method for immersion lithography is provided. The method includes following operations. A wafer is positioned under a lens system using a wafer stage. A pattern is projected onto the wafer using the lens system while confining an immersion fluid to a region of the wafer using an immersion hood, in which the immersion hood includes a peripheral hole configured to suck up the immersion fluid. Whether there is contamination in the peripheral hole is detected using an inspection system coupled to the wafer stage. The contamination in the peripheral hole, if detected, is removed using a cleaning fluid supplier coupled to the wafer stage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for immersion lithography the method comprising:
    positioning a wafer under a lens system using a wafer stage, wherein an immersion hood formed with an aperture and a plurality of peripheral through holes receives an end of the lens system in the aperture, and the aperture allows fluid communication between the system and the wafer;
    injecting an immersion fluid to the aperture of the immersion hood;
    projecting a pattern onto the wafer using the lens system while confining the immersion fluid to a region of the wafer and not to the peripheral through holes by using the immersion hood;
    detecting whether there is contamination in the peripheral through hole by using an inspection system which is coupled to the wafer stage and which comprises a camera, wherein detecting whether there is contamination in the peripheral hole using the inspection system coupled to the wafer stage comprises capturing an image of the peripheral hole by using the camera; and
    removing the contamination in the peripheral through hole, if detected, by using a cleaning fluid supplier coupled to the wafer stage and the inspection system, wherein the camera and the cleaning fluid supplier are integrated with the wafer stage and outside a region occupied by the wafer.

2. The method of claim 1, wherein detecting whether there is the contamination in the peripheral through hole using the inspection system, which is coupled to the wafer stage and which comprises the camera, and removing the contamination in the peripheral through hole using the cleaning fluid supplier coupled to the wafer stage and the inspection system before positioning the wafer under the lens system using the wafer stage.

3. The method of claim 1, wherein detecting whether there is the contamination in the peripheral through hole is performed during projecting the pattern onto the wafer using the lens system.

4. The method of claim 3, wherein projecting the pattern onto the wafer using the lens system is stopped if the contamination is detected.

5. The method of claim 1, wherein the inspection system is configured for automatic in-line detection of contamination in the peripheral through holes.

6. The method of claim 1, wherein the inspection system further comprises an image comparison module coupled to the camera, and detecting whether there is the contamination in the peripheral through hole using the inspection system further comprises:
    comparing the image with a comparison image to confirm whether there is the contamination in the peripheral through hole using the image comparison module.

7. The method of claim 6, wherein detecting whether there is the contamination in the peripheral through hole using the inspection system further comprises:
    transferring the image to the image comparison module before comparing the image with the comparison image.

8. The method of claim 6, wherein detecting whether there is the contamination in the peripheral through hole using the inspection system further comprises:
    providing the comparison image to the image comparison module before comparing the image with the comparison image.

9. The method of claim 1, wherein removing the contamination in the peripheral through hole by using the cleaning fluid supplier coupled to the wafer stage and the inspection system is conducted by supplying a cleaning fluid through the peripheral through hole by the cleaning fluid supplier.

10. The method of claim 9, wherein the cleaning fluid is a material selected from water, clean air, nitrogen, inert gas and a combination thereof.

11. The method of claim 1, further comprising sucking up the immersion fluid using the cleaning fluid supplier during projecting the pattern onto the wafer using the lens system.

12. The method of claim 1, further comprising checking whether the contamination has been removed after removing the contamination in the peripheral through hole by using the cleaning fluid supplier.

13. The method of claim 12, wherein checking whether the contamination has been removed is conducted by the inspection system.

14. The method of claim 1, wherein circulating the immersion fluid is performed during projecting the pattern onto the wafer by using the lens system.

15. The method of claim 1, wherein the cleaning fluid supplier is adjacent to the camera.

16. The method of claim 1, wherein the camera and the cleaning fluid supplier are embedded within the wafer stage.

17. The method of claim 1, wherein the camera is watertight.

18. The method of claim 1, wherein the cleaning fluid supplier has an outlet parallel to an axis of the peripheral through hole.

19. The method of claim 1, wherein the peripheral holes are arranged along an edge of the immersion hood.

20. The method of claim 1, wherein the camera is a charged coupled device (CCD) camera.

* * * * *